United States Patent
Curtin et al.

(10) Patent No.: US 8,141,019 B2
(45) Date of Patent: Mar. 20, 2012

(54) METHOD FOR OPTIMIZING OF PIPELINE STRUCTURE PLACEMENT

(75) Inventors: James J. Curtin, Fishkill, NY (US);
Douglas S. Search, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 12/348,380

(22) Filed: Jan. 5, 2009

(65) Prior Publication Data

US 2009/0106711 A1    Apr. 23, 2009

Related U.S. Application Data

(62) Division of application No. 11/425,721, filed on Jun. 22, 2006, now Pat. No. 7,496,866.

(51) Int. Cl.
*G06F 17/50* (2006.01)
(52) U.S. Cl. .................. 716/119; 716/113; 716/139
(58) Field of Classification Search .................. 716/113, 716/119, 139
See application file for complete search history.

(56) References Cited

U.S. PATENT DOCUMENTS

| | | | |
|---|---|---|---|
| 5,850,537 A | 12/1998 | Selvidge et al. | |
| 6,546,542 B2 | 4/2003 | Yumoto et al. | |
| 6,594,814 B1 | 7/2003 | Jou et al. | |
| 6,654,939 B2 | 11/2003 | Yamamoto et al. | |
| 6,684,373 B1 | 1/2004 | Bodine et al. | |
| 6,836,875 B2 | 12/2004 | Porterfield | |
| 7,669,160 B2 * | 2/2010 | Furnish et al. | 716/119 |
| 2004/0158806 A1 | 8/2004 | Scheffer | |
| 2005/0055655 A1 | 3/2005 | Augsburg et al. | |
| 2005/0251765 A1 | 11/2005 | Ahmad et al. | |

FOREIGN PATENT DOCUMENTS

JP    7319938    12/1995

OTHER PUBLICATIONS

"High Order Synthesis Method", Masuda Tokuji, Patent Abstracts of Japan, Pub No. 2001-249955, Sep. 14, 2001.
"Microarchitecture Evaluation with Floorplanning and Interconnect Pipelining", Janannathan et al., 2005 IEEE, ASP-DAC 2005, pp. I-8 through I-15.
"A Methodology for Optimal Repeater Insertion in Pipelined Interconnects", Pasquale Cocchini, IEEE Transactions on Computer-Aided Design of Integrated Circuits and Systmes, vol. 22, No. 12, Dec. 2003, pp. 1613-1624.
"Voltage Scaling, Wire Sizing and Repeater Inserter Design Rules for Wave-Pipelined VLSI Global Interconnect Circuits", Deodhar et al., Proceedings of the Sixth International Symposium on Quality Electronic Design (ISQED '05), pp. 1-6.
"Procedure and Design to Facilitate Self Timed Implementations of Combinational Logic", PJ Klim, IBM Technical Disclosure Bulletin, May 1994, pp. 493-496.

* cited by examiner

*Primary Examiner* — Thuan Do
(74) *Attorney, Agent, or Firm* — William A. Kinnaman, Jr.

(57) ABSTRACT

A circuit design process is executed to preserve overall design quality while obtaining quality placements for a full class of pipeline structure signatures. The process employs a method for optimizing pipeline structure placement in a circuit design, by initiating an analysis of pipeline logic structures for correcting poor quality of result (QOR) placements by identifying poor placements caused by placement algorithmic response to degenerate cases and in the process of analysis preserving high quality placements of global placement and timing to preserve preponderant non-degenerate cases in said circuit design. Then employing a plurality of global placement steps, wherein each subsequent placement's QOR is dependent upon the prior placement's quality of result QOR, circuits are identified as being involved in a class of degenerate cases, and circuits having poor placements are removed by stripping them from the global placement solution and also other non-degenerate poor quality placements are corrected.

6 Claims, 9 Drawing Sheets

SINGLE CYCLE L – L DISTANCE VIOLATES TIMING TARGET

LATCH TO LATCH DISTANCE

MULTI-CYCLE PIPELINE PATH LATCH PLACEMENT BEHAVIOR

ACTUAL LATCH LOCATIONS FOR PIPELINED TIMING PATHS

CHIP 'X' PIPELINE TYPES

▫ LATCH PIPELINES
  ▹ L-L-L-L-L
  ▹ L-L-L
  ▹ L-L-L-L
▫ MIXED LOGIC PIPELINES
  ▹ L-M-L-M-L-M-L-M-L-M-L-M-L-M-L-M-L->(14 STAGES)
  ▹ L-L-M-A-L-M-A-L
  ▹ L-L-L-L-A-O-O-A-A-L
  ▹ L-L-A-L
  ▹ L-L-O-O-L
  ▹ L-L-L-A-L-M-L
  ▹ L-L-L-M-A-L
  ▹ L-L-L-L-M-L
▫ INCOMPLETE PIPELINES
  ▹ L-L-L-A-L-X-O
  ▹ L-L-L-M-N-N
  ▹ L-L-L-A-L-C-N-O
  ▹ etc RESULTS USING NEW EQUILIBRIUM POINT SOLUTION COORDINATES
REPLACEMENT PROCESS ON ALL FAILING PIPELINES

- INITIAL PLACEMENT
  - OF THE 3,209 DESCRIBED PIPELINES, 739 (23%) OF THEM CONTAIN FAILING PATHS AFTER INITIAL PLACEMENT OPTIMIZATION.

|  | # PIPELINES WITH FAILING PATHS | # PIPELINES WITH NO FAILING PATHS |
| --- | --- | --- |
| BEFORE PIPELINE METH APPLIED | 739<br>100 % | —<br>0 % |
| AFTER PIPELINE METH APPLIED | 64<br>8 % | 675<br>92 % |

FIG.5

RESULTS USING NEW EQUILIBRIUM POINT SOLUTION COORDINATES
REPLACEMENT PROCESS ON ALL FAILING PIPELINES

- TDP PLACEMENT

|  | # PIPELINES WITH FAILING PATHS | # PIPELINES WITH NO FAILING PATHS |
| --- | --- | --- |
| BEFORE PIPELINE METH APPLIED | 798<br>100 % | —<br>0 % |
| AFTER PIPELINE METH APPLIED | 90<br>11 % | 708<br>89 % |

FIG.6

PIPELINE BEHAVIOR SUMMARY
○ PIPELINE METHODOLOGY RESULTS
✦ 798 PIPELINES CONTAIN FAILING PATHS WITHOUT THE PIPELINE METHODOLOGY; WITH THE PIPELINE METHODOLOGY THE RESULTS ARE AS FOLLOWS:
FIG.7
| 798 TOTAL | PERCENTAGE | AVG. DELTA DELAY |
|---|---|---|
| 708 FIXED | 89 % | |
| 55 BETTER | 7 % | + 457 ps |
| 17 WORSE | 2 % | − 150 ps |
| 18 NEW | 2 % | − 67 ps |
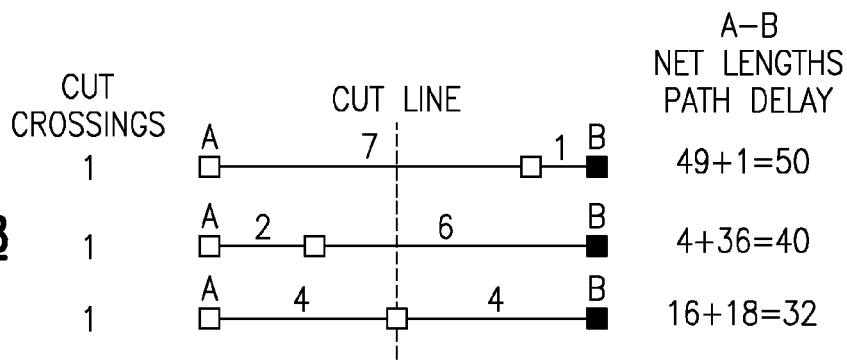
FIG.8
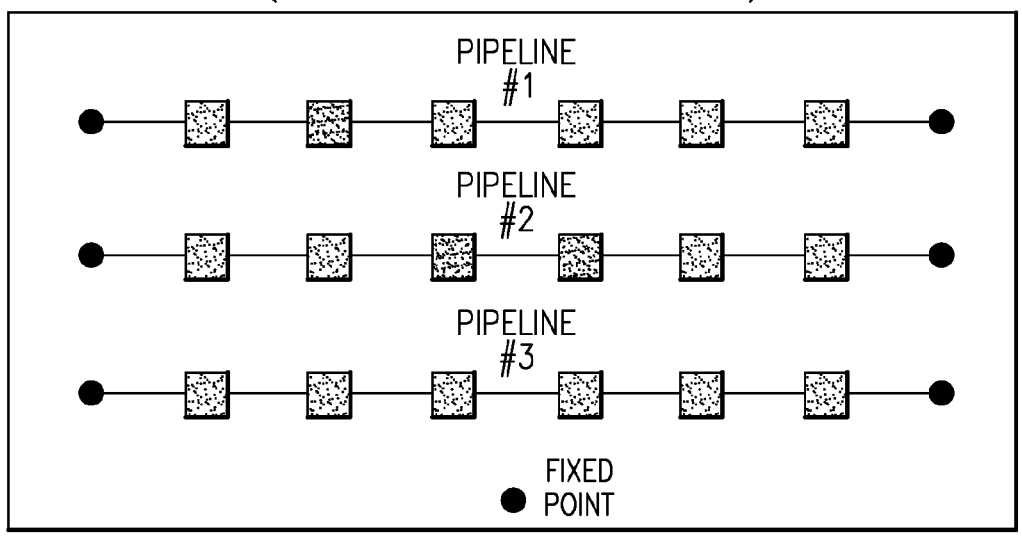
FIG.9

METHOD FOR OPTIMIZING OF PIPELINE STRUCTURE PLACEMENT

RELATED APPLICATIONS

This application is a divisional application based on U.S. Ser. No. 11/425,721 filed Jun. 22, 2006 now U.S. Pat. No. 7,496,866 now entitled Method for Optimizing of Pipeline Structure Placement.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to the performance optimization of integrated circuit (IC) designs, and particularly to a faster, more efficient approach to timing closure for integrated circuit designs containing pipeline logic structures, especially where the logic compositions of said pipelines structures are unrestricted in their definition.

2. Description of Background

Within IBM automated design of integrated circuits generally employs a suite (mix) of IBM design tools and algorithms to simultaneously address the problems of performance optimization and full design wireability, such as those netweight solutions described in US patent of Publication Numbers US20060015836 A1 dated Jan. 19, 2006 and US20060010410A1 dated Jan. 12, 2006 illustrating improvements which are now included within a tool set called IBM PISCES and used internally by IBM. Such mixtures have proven effective in achieving these goals for a majority of integrated circuit designs and logic configurations. However, certain specific logic connectivity scenarios and physical configurations have not responded well to this methodology approach. This class of special connectivity scenarios forms a set of degenerate cases when standard linear and quadratic algorithms are employed in design optimization. One case in point has been logic pipeline structures. The placement of logic pipelines in response to standard design optimization tools and algorithms has been poor—resulting in timing violations and missed performance objectives.

Before our invention, designers used simple scripts to replace the failing pipeline logic. Creation of the scripts carried with it an overhead in manpower and design time. More problematic was the fact that this approach was not very effective for complex pipeline structures. These structures, unlike classic latch to latch pipelines, contained functional logic between the latches for at least some portion of the pipeline. In such cases the ineffectiveness of simple scripts forced designers to resort to more manually directed operations. These operations carried a considerable burden in manpower, and had a considerable impact on design closure schedules.

SUMMARY OF THE INVENTION

The shortcomings of the prior art are overcome and additional advantages are provided through the provision of a design methodology and process which is an effective approach to preserving overall design quality while obtaining quality placements for a full class of pipeline structure signatures. These signatures include classic latch to latch pipelines, as well as a variety of latch to latch and mixed logic pipelines. The process accomplishes its objectives in an automated flow whose impact to design schedules and human resources is much smaller than existing methods.

Our method can be used as a service for performing optimization of circuits, and provides tools not present before in systems used internally within IBM. Media can contain instructions for performing the process provided, and this media can be stored on a tangible device, such as a C-D ROM.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which corrects pipeline structure timing violations for an entire class of pipeline profiles—both simple latch to latch, and mixed logic pipeline configurations. The solution preserves the quality of the overall design's placement and timing while improving the quality of pipeline placement and timing in an automated process. This approach realizes a significant savings in both the manpower and elapsed time required to solve the problem.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 illustrates one example of the efficacy of the pipeline process described as it applies to Initial Placement. It shows an order of magnitude reduction in timing fails for pipeline structures compared to current automated optimization methods.

FIG. 6 illustrates one example of the efficacy of the pipeline process described as it applies to Timing Driven (TDP) Placement. It shows approximately an order of magnitude reduction in timing fails for pipeline structures compared to current automated optimization methods.

FIG. 7 illustrates one example for the remaining failing pipelines, of the amount of timing improvement achieved compared to the original timing state resulting from current automated optimization methods FIG. 8 illustrates one example of the degeneracy class exposure exhibited by linear total net length algorithms for special connectivity cases.

FIG. 9 illustrates one example of the quadratic minimization equilibrium point solutions (placements) achieved for variety of pipeline signatures, based purely on their net list connectivity and nodal characteristics.

The detailed description explains the preferred embodiments of the invention, together with advantages and features, by way of example with reference to the drawings.

DETAILED DESCRIPTION OF THE INVENTION

Figure 1:
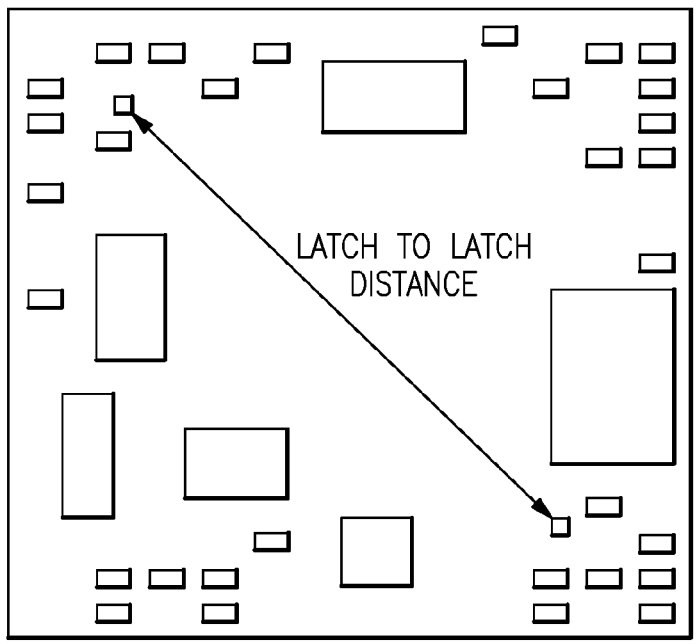
FIG. 1 illustrates one example of a timing violation on a latch to latch path caused by the excessive distance between the placed source latch and destination latch.

As chip cycle times have decreased, chip sizes and integration levels have increased. These factors have conspired to produce an ever increasing population of excessive path source-to-sink distances (FIG. 1). The ability to close timing on these paths ranges from problematic to impossible. Often these long path distances are non-negotiable due to Floor planning and logic global connectivity constraints. When possible, designers seek to traverse the distance in multiple cycles by means of a sequence (pipeline) of timing paths which meet their individual single cycle time requirements. As a result, pipeline usage is becoming more prevalent.

Figure 2:
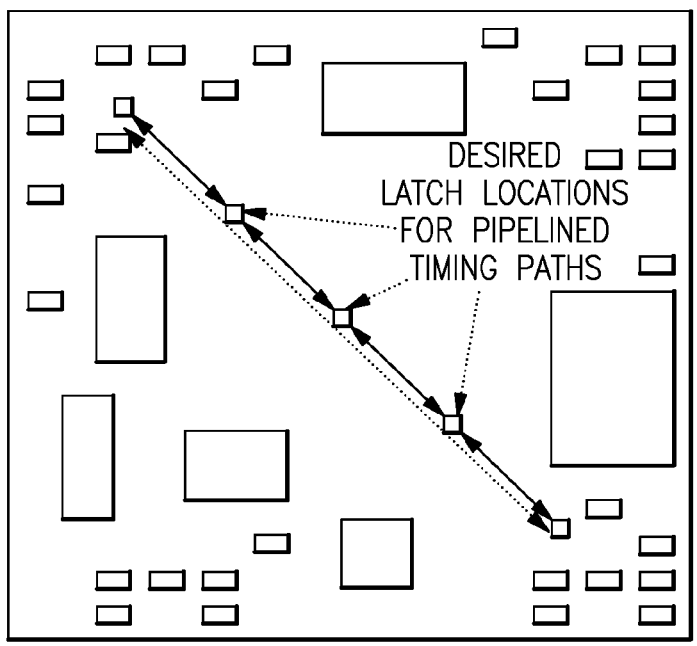
FIG. 2 illustrates one example of the desired placement for the latches of a pipeline structure, in order to equi-partition the time delay between the source and destination latches of the pipeline.

The designer's desire and expectation is that the individual single cycle paths will be placed in such a way that the multi-cycle distance will be partitioned into equal subdivisions—each subdivision path distance being short enough to support its single cycle timing requirement (FIG. 2).

Figures 3, 4:
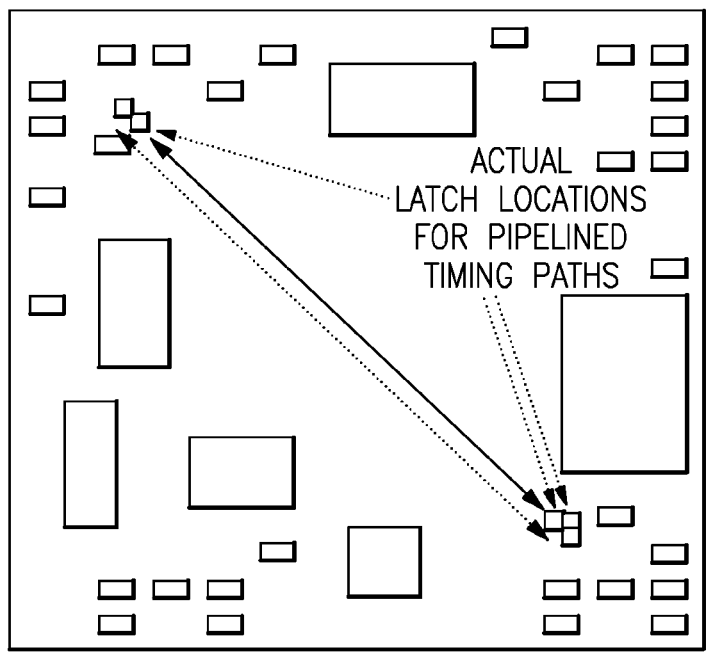
FIG. 3 illustrates one example of the actual placement of pipeline latches caused by the standard application of quadratic and linear algorithms and their cost functions
FIG. 4 illustrates one example of the variety of pipeline structure profiles/compositions/signatures that have been implemented in integrated circuit designs.

Increased usage of pipeline structures has given rise to an increased incidence of timing failures associated with pipelines' unique connectivity characteristics and the placement behavioral response to those characteristics. Current chip and macro design methodologies invoke placement tools which incorporate within their algorithms a variety of metrics and objective functions. For those placement tools with linear objective functions there is a placement quality exposure. Certain logic connectivity scenarios (e.g. pipeline structures) can create degenerate cases for placement tools using these algorithms and objective functions. Consequently, the placements for these logic structures can produce extreme net length differences and severely unbalanced path delays within the pipelines (FIG. 3). The resulting timing violations for the pipeline paths can be so large in magnitude that they cannot be rectified by the normal post-placement optimization tool suites. Forms of manual intervention are required.

An additional factor complicates the picture. Not all pipelines are the same! Some pipelines are classic types—composed entirely of latches. Other pipelines are mixed logic pipelines, having both latch to latch paths as well as latch to logic to latch paths within the same pipeline (FIG. 4). Some pipelines are pure latch to latch (L-L) while others contain paths with AND, OR, XOR, MUX, NAND logic (A, O, X, M etc).

For these mixed logic pipeline designs there is no current viable solution. Deterministic post placement repositioning of pipeline latches by manual methods requires an unacceptable increase in design turn around time when the number of pipelines approaches triple digits.

Simple scripted methods can process hundreds of pipelines quickly but will not be effective when mixed logic pipelines are present. Designs currently exist with over ten thousand pipelines having a multitude of classic and mixed logic pipeline types.

The process we describe preserves the general quality of the global placement established by the existing suite of placement algorithms; while repairing poor quality placements associated with the logic connectivity degenerate cases (e.g. pipelines). To do this the proposed methodology establishes an initial placement using the normal placement algorithm set. The pipelines with timing violations are then stripped from the placement solution and replaced using a method which circumvents all placement algorithms which contribute to the placement quality problem. This method obtains equilibrium point solution coordinates derived from quadratic length minimization equations modified by timing-derived net weight factors. These equilibrium point solution coordinates are implemented as the placement locations applied to the 'unplace/replace' pipeline cells. After the step of unplacing poor placements, a result is then legalized. This process is repeated each time for a new dynamic Global placement is generated.

This methodology can be scripted and executed on many thousands of pipelines as an incremental placement following a general dynamic Global placement with minimal impact to design turn around time. Because of the timing-derived net weights, the methodology is effective for both classic and mixed logic pipeline types. It has been executed in prototype form on an existing test case and reduced the number of pipeline timing violations by an order of magnitude (FIGS. 5 & 6). It also improved the timing status on many of the remaining pipeline timing violations by an average of 450 ps (FIG. 7). All of the results shown below in FIGS. 5, 6, & 7 are timing results achieved by placement alone and do not include the optimization capabilities of post placement logic transforms optimization execution.

Current placement tools employ a number of different placement sub-steps and accompanying algorithms in their execution. Within this collection of algorithms, multiple metrics and objective/cost functions are exercised. Some of these functions are length-based quadratic and linear functions.

While this suite of placement optimization algorithms works well for the vast majority of logic placement and connectivity scenarios; there may exist a class of logic connectivity special situations which form a set of degenerate cases for placement.

Specifically, single input/single output logic nodes may be susceptible to degenerate placement behavior and poor placement quality. Although classic latch to latch pipeline structures represent the most obvious example of this special logic node connectivity configuration, there are other examples. Single net, single fanout repowering tree structures which are hidden by designers from repower tree stripping prior to placement is one example. Another example is multiple input logic circuit nodes (AND, NAND, NOR etc) where all but one input net and output net are ignored for placement due to their logic function or fanout status. Cases like these are rare, but can occur in small numbers on many designs.

When these single input/single output logic connectivity nodes are processed by linear length-based placement algorithms, the degeneracy of this scenario manifests itself as an infinite number of equally viable optimization solutions (FIG. 8). In the example shown below, a quadratic (Length squared) metric yields a single minimized solution; where the moveable object between A and B is placed so that the net lengths are equal, and the Total Net Length Squared value is 32. A linear algorithm of Total Net Length (TNL) yields the same minimal solution of '8' for all possible placement locations of the moveable object.

Thus for the TNL linear function, there is no capability to discriminate an optimal result among the myriad of potential solutions. As a result the effects of ancillary objective functions, factors, and algorithms are amplified and become prominent. Even data processing methods—which in normal circumstances are transparent to the final placement result—may directly determine the placement outcome. Actual placement results indicate that placement aberrations can achieve the most extreme degenerate behavior possible. Such placement behavior is often not remediable by the post placement optimization techniques currently employed.

Designers are forced to resort to either manual repositioning of the poorly placed objects or—when symmetry allows—creation of scripted procedures to do the repositioning using location data and algebraic formulas.

Manual repositioning is only feasible when small numbers of pipelines or other logic structures are affected. Simple scripted repositioning will not be effective when complicated mixed logic pipelines are present.

The behavioral problem appears in all major phases of Global placement, including the primary placement algorithm—the recursive partitioning process that develops the fundamental characteristics of the Global placement. As a result any post placement incremental replacement of failing pipeline logic which uses these algorithms will be tainted by the same degeneracy that was incurred in the original Global placement.

To overcome this problem a new pipeline methodology is required. The challenges to that methodology are:
 preserve the quality of the general design placement established by the placement tool's suite of algorithms
 remove timing violations in pipelines through creation of a high quality placement for Pipeline structures
 achieve that high quality placement while circumventing the entire suite of placement algorithms which gave rise to the Pipeline placement problem
 produce a quality placement result for all pipeline types—both classic latch to latch pipelines and mixed logic pipelines.
 preserve that quality throughout the placement optimization process—both initial placement and timing driven placement stages.

This methodology addresses each of those challenges.

The first step in this methodology is to establish a Global placement for the entire design using the placement algorithms which cause poor pipeline quality. Pipelines which contain timing violations due to failing paths will have their pipeline latch and logic circuits stripped from the Global Placement. The remainder of the Global placement will be preserved by essentially Fixing the global placement through the use of a 'place unplaced only' capability applied to the pipeline circuits. After pipeline circuits have been re-placed against the Fixed Global placement background, legalization of the pipeline circuit placements is executed. The minimal placement perturbation to the general design caused by this legalization ensures that the placement and timing quality of the general design will be maintained.

In order to achieve high quality placements for pipelines and other single fanin/fanout structures, all placement algorithms which introduce the degenerate placement behavior must be circumvented. In the current placement tool, all of the phases (steps) within the placement tool sequence seem to exhibit this behavior. This includes the main global recursive partitioning algorithm which establishes the main characteristics of the placement.

As was mentioned above, the designer's desire is a placement of pipeline circuits that will partition the pipeline distance into equal single cycle path subdivisions and implied balanced single cycle path delays (FIG. 2). The discussion on Quadratic vs Linear metrics above, (FIG. 8) indicates a potential solution. The Total length squared minimization goal is satisfied by only one placement location, and that location partitions the A to B distance into two equal subdivisions (nets). Although a simple two net case is shown above, The principle of equi-partitioning extends to the general case of N nets and N−1 circuits between two points. For quadratic solutions involving equal netweights, equilibrium is achieved when all nets are equal to each other in length. Another simple example is shown below (FIG. 9).

Three independent groups of logic, connected to separate fixed point pairs, achieve their quadratic minimization equilibrium point solution when their constituent nets are equal to one another. This example is introduced for two reasons. First to show simplistically the balanced subdivisions (equal net lengths) among nets in each logic string. Secondly, this template will be used to show why timing-derived net weights must drive the balancing of pipeline paths when mixed logic pipelines are encountered (see below).

Figure 10:
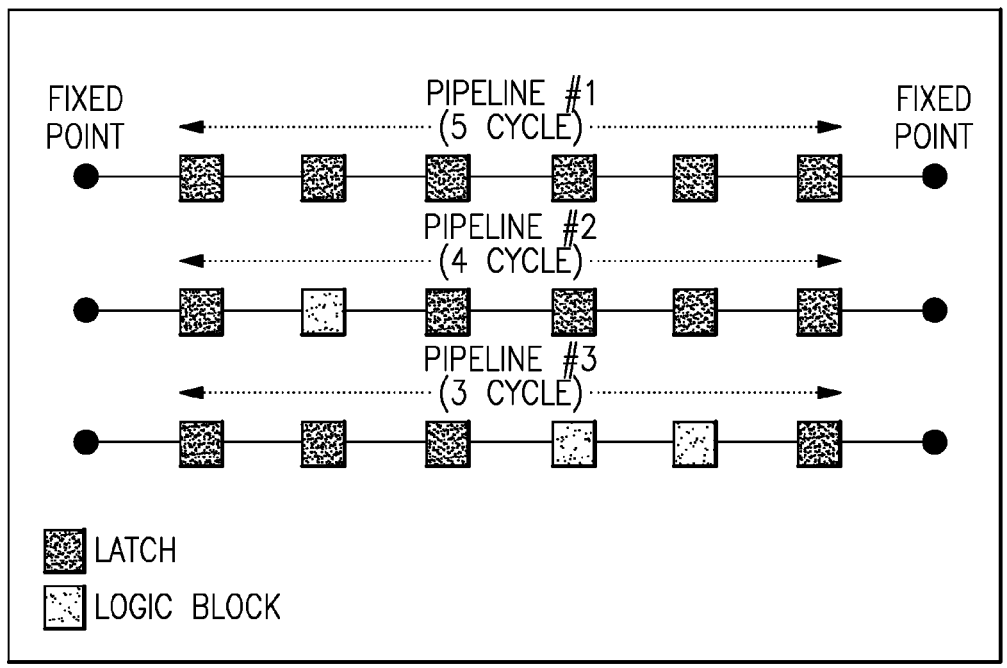
FIG. 10 illustrates one example of the underlying logic composition of various pipelines, which is irrelevant to placement equilibrium point solutions for quadratic algorithms.

Placement algorithms are ignorant of logic functional composition. These algorithms see all logic circuits as equivalent objects (nodes) and treat them accordingly. Timing however, is very much dependent upon the logic identity of each 'equivalent' object. If the logic composition of the placement solution in FIG. 9 is revealed (FIG. 10), the timing implications of unweighted pipeline placement are seen to be significant.

Figure 11:
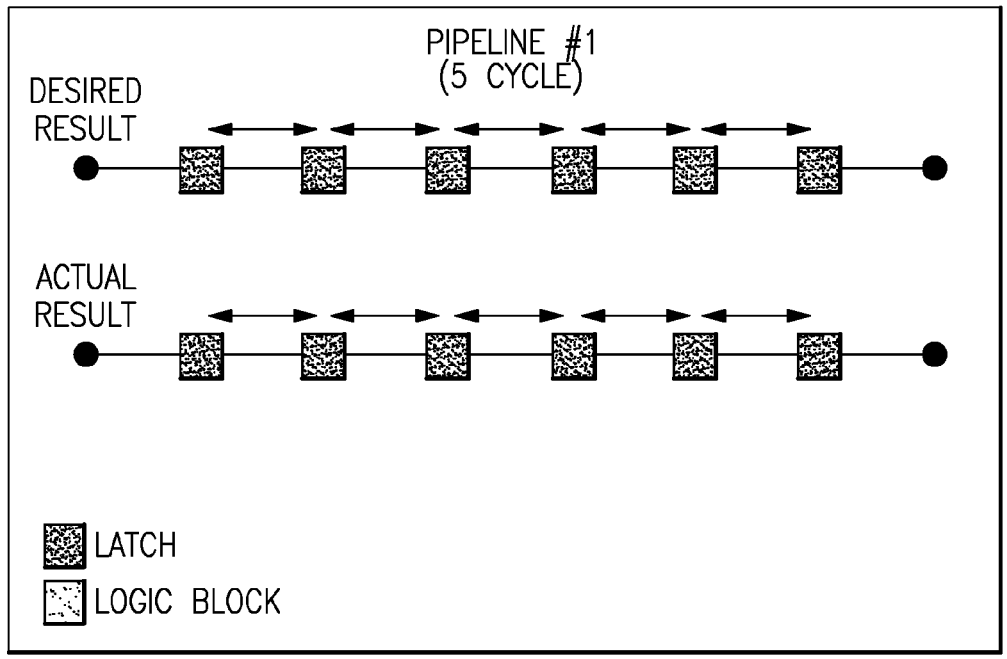
FIG. 11 illustrates one example of how logic-unaware quadratic placement solutions can result in correct pipeline distance partitioning and time delay budgeting within classic latch to latch pipelines.

For classic Latch to Latch pipelines like Pipeline #1, the equilibrium solution for unweighted placement produces a balanced solution for the single cycle paths in the pipeline that satisfies the designer's objectives and expectations (FIG. 11)

Figure 12:
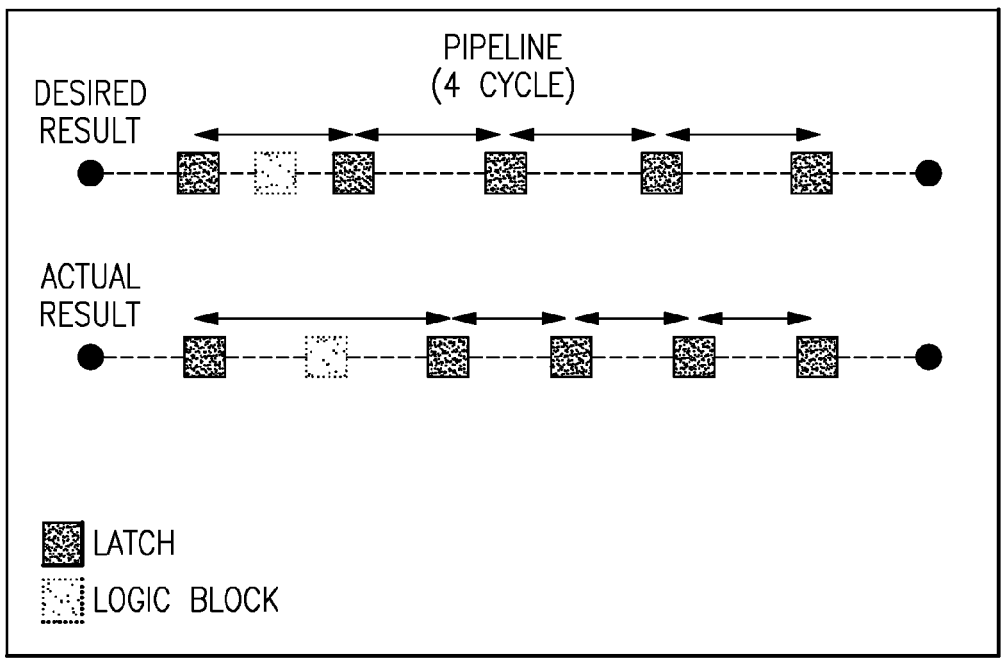
FIG. 12 illustrates one example of how logic-unaware and timing-unaware placement solutions result in undesired distance partitioning and delay budgeting when mixed logic paths are part of the pipeline. This indicates the need for timing-derived net weights to drive the placement solution.
Figure 13:
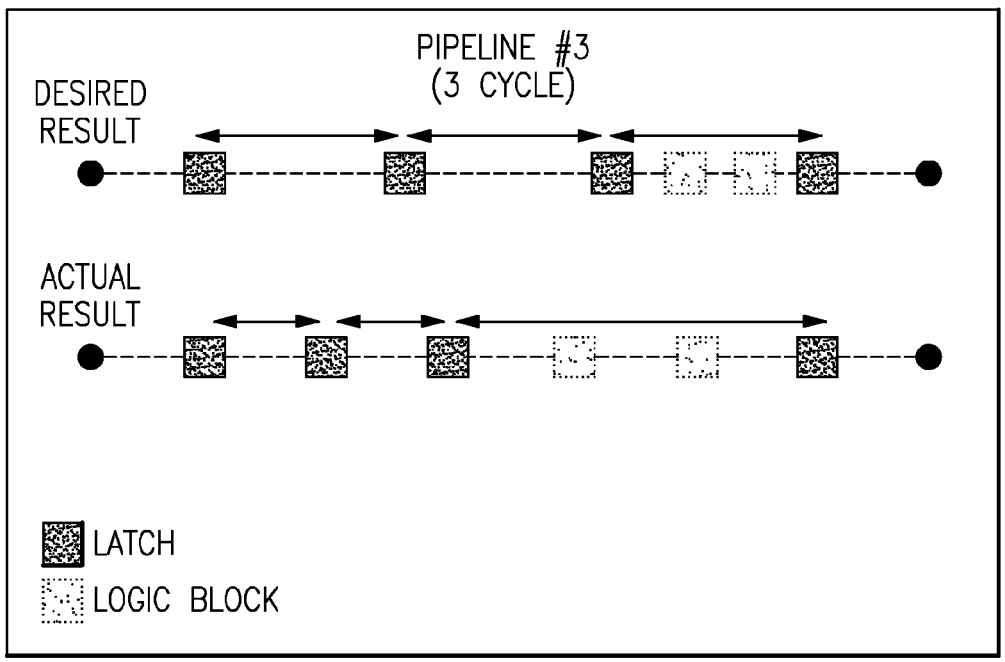
FIG. 13 illustrates one example of how logic-unaware placement solutions result in greater deviation from distance equi-partitioning and desired delay budgeting as the amount of logic in one of the pipeline's paths deviates from the amount of logic in the other paths of the pipeline.

For mixed logic pipelines like Pipeline #2 the unweighted equilibrium point solution produces a natural imbalance in the constituent single cycle paths of the pipeline (FIG. 12). The greater the amount of logic mismatch between single cycle paths such as in Pipeline #3 (FIG. 13); the greater the path to path timing imbalance within the pipeline.

To correct for this natural path to path imbalance, timing-derived net weights should be used to customize the equilibrium point solution so that it compresses the net lengths for those paths with extra logic between the latches. In addition it should be remembered that the examples shown here are simplifications which allow pipeline logic to line up along a single axis. In real scenarios the mixed logic pipelines contain AND and OR gates with multiple input net connections. This results in a vector solution for the equilibrium point placement locations and not a simple straight line subdivision of the pipeline distance. As a result simple scripts—based on algebraic straight line assumptions for the pipeline—will not be effective mechanisms for optimizing the design's overall timing. These timing derived net weights will also work correctly for classic latch to latch paths. Since each Latch to Latch path is timed identically, the net weights derived for each path will be equal and will result in the correct placement behavior.

Figure 14:
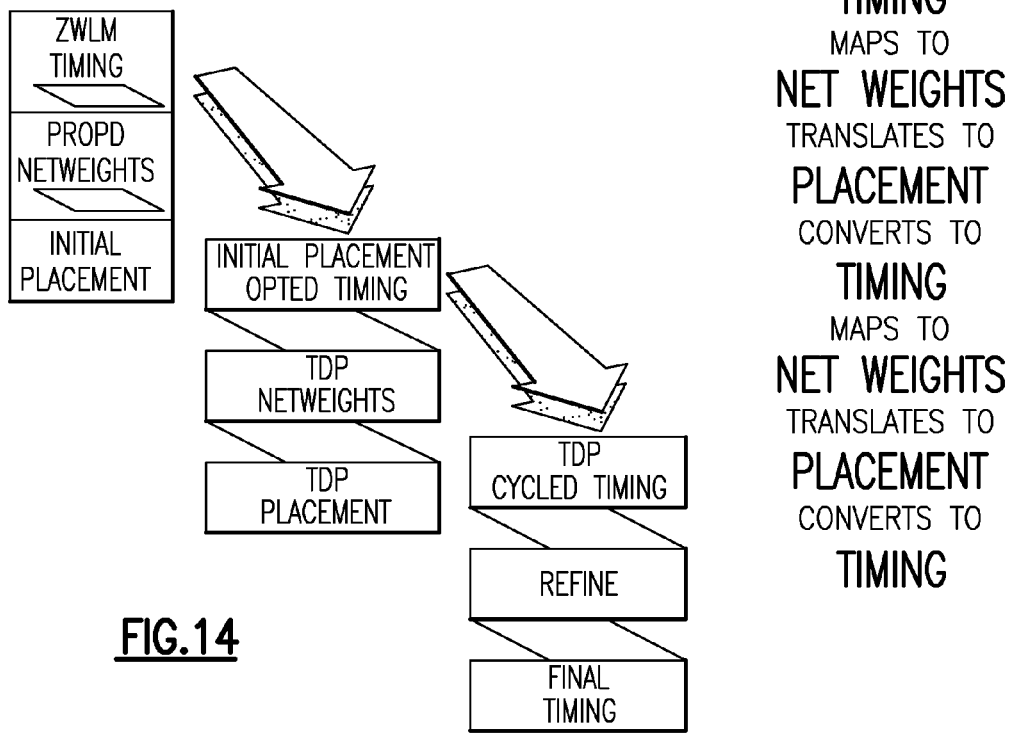
FIG. 14 illustrates one example of a design optimization methodology flow indicating the sequential dependency of timing, net weight mapping, and placement on each other within an iterative process.

There is an intimate relationship between the interim stages of initial and timing driven placement and the final timing quality for the design. If timing-derived net weights are employed to drive placement optimization, then all timing evaluations, all net weights, all placement results, and all timing optimization activities are linked together in one continuous serially dependent process (FIG. 14). Design evolution is fashioned by the progression of design states and the tool response to those states. Timing results are mapped into net weights, which translate into placement results, which are converted through timing optimization activities into timing results. These timing results are then mapped into a new set of net weights, which drive a new placement solution and give rise through timing optimization activities to a new set of timing results.

Figure 15:
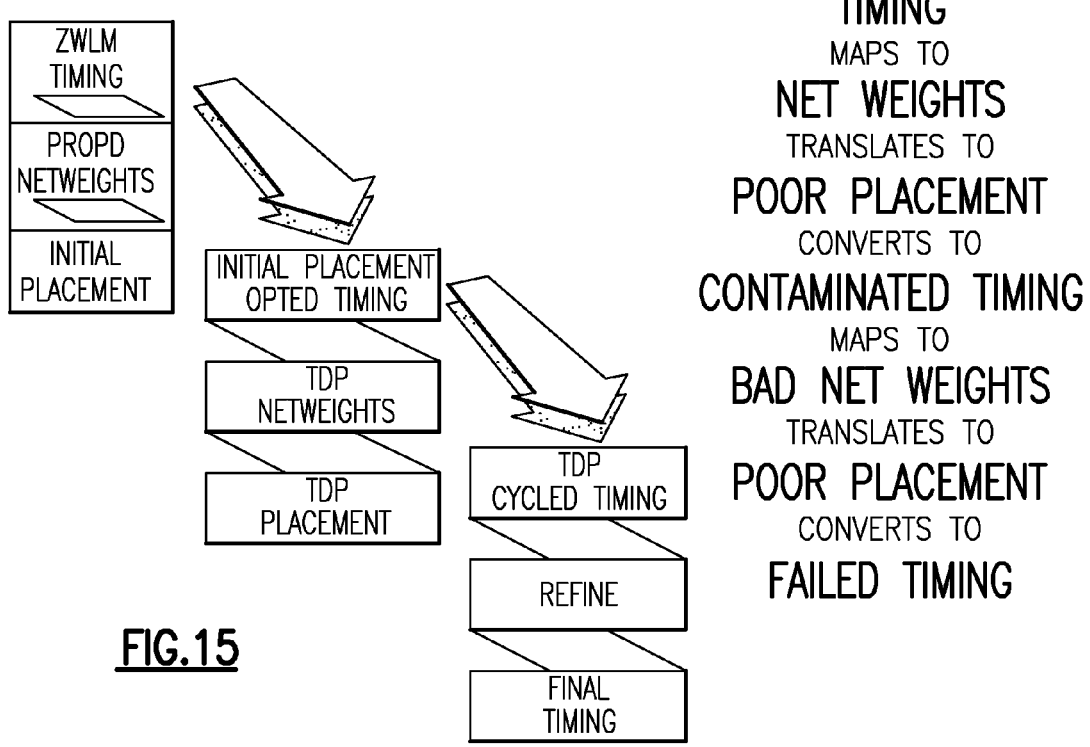
FIG. 15 illustrates one example of the propagation of poor placement results into poor timing results through the sequential dependencies of the iterative flow. It illustrates why degeneracy behavior must be corrected at major stages of the flow in order to preserve final quality timing for pipelines at the end of the process.

Any contamination of this process by poor quality placement, timing, or mapping results has an opportunity to propagate through the process (FIG. 15). Poor quality pipeline placement behavior is an example of this contamination.

When a pipeline placement results in balanced path delays within the pipeline, the pipeline paths have balanced time delays and slack values. As a result, the mapping of path slacks into net weights (to drive the next placement) produces equal net weights. These equal net weights imply a control for placement which intends to preserve the path delay balance within the pipeline.

When a pipeline placement results in extremely unbalanced path delays within a pipeline, the mapping of path timing into net weights produces a varied set of net weights. Paths with large time delays and poor slack status will be given highly elevated net weights. Paths with small delays will be assigned small net weights. This net weight assignment will drive placement to compress the large time delay paths and elongate the paths which have small delays. Normally this is good because it attenuates the time delay imbalance among pipeline paths. However, with the huge time delay imbalances among pipeline paths caused by the current behavior problem and subsequent net weight mapping; the placement compression/elongation response can easily overshoot—causing the small and large time delay paths to change places. This produces a path to path imbalance in tdp placement which is akin to the imbalance in initial placement. The only difference is that the passing/failing paths within the pipeline have exchanged positive/negative slack status.

To avoid the possibility of propagating the effects of poor quality pipeline placement from placement to placement, the corrective actions suggested in the Pipeline methodology must be executed after each Global placement.

Figure 16:
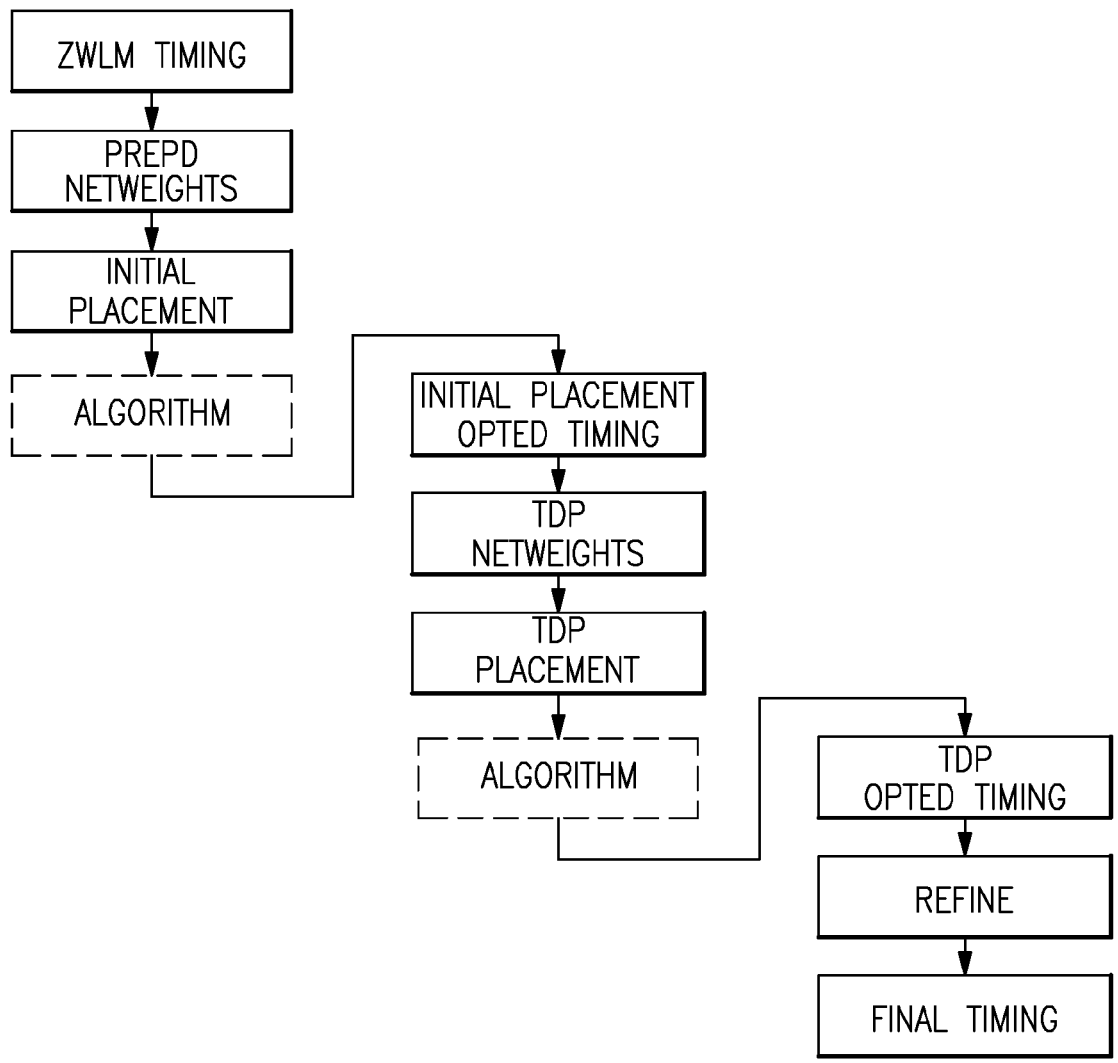
FIG. 16 illustrates one example of where the new pipeline methodology algorithm and process would be executed within the design methodology flow.
Figure 17:
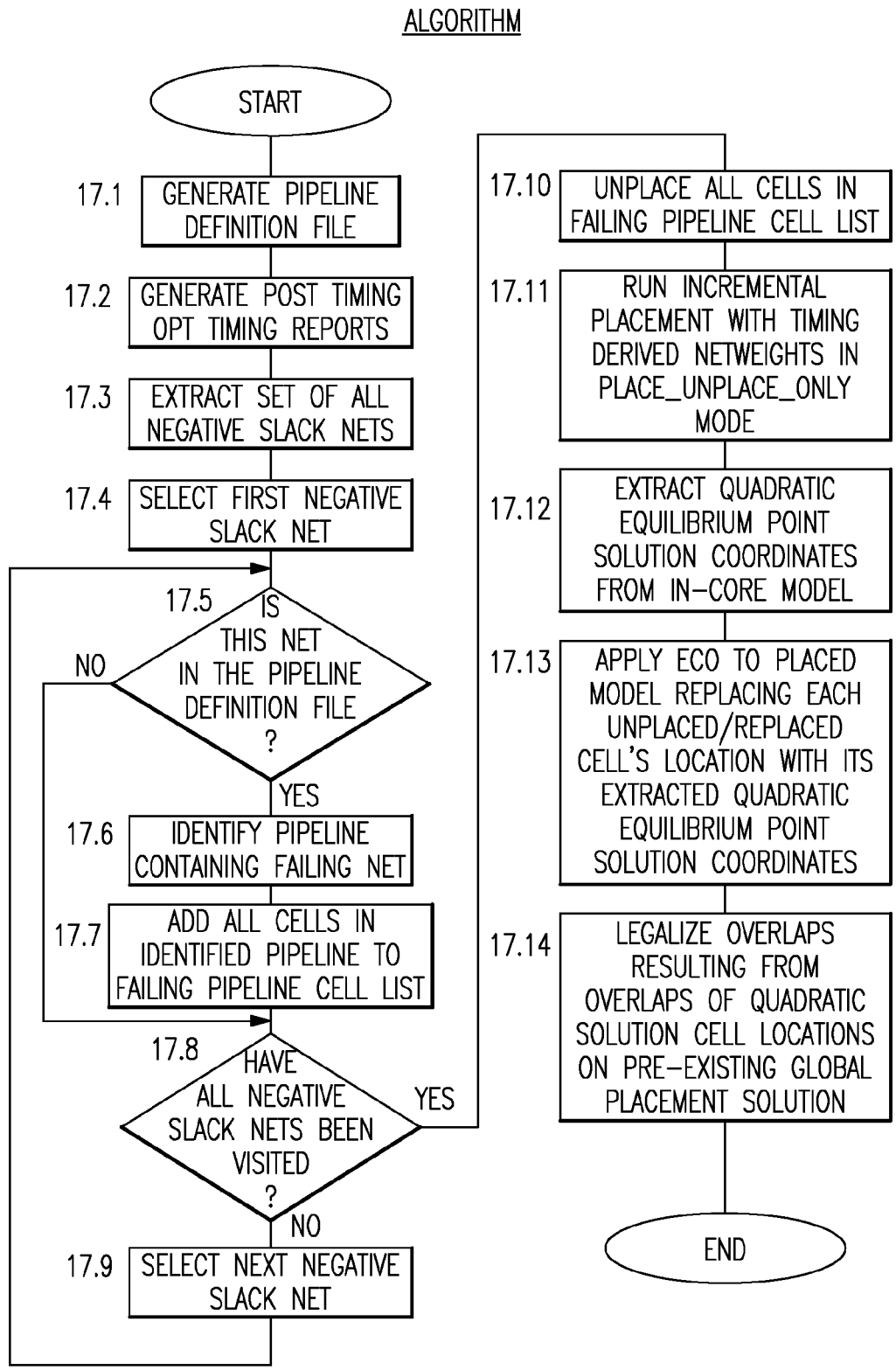
FIG. 17 illustrates one example of implementation of the new automated pipeline process. Detailed steps and sequence structure is described.

FIGS. 16 and 17 illustrate the Pipeline Methodology Process flow as it was implemented in the prototype form described earlier. In FIG. 16, the two dashed line blocks, labeled "Algorithm", indicate the points where the pipeline methodology described in this invention have been inserted into the existing process flow. FIG. 17 details the individual steps performed within the block marked "Algorithm" (FIG. 16). They are as follows:

The first action performed in the pipeline algorithm is the generation of the pipeline definition file (17.1). This file simply identifies the set of nets belonging to each particular pipeline in the design. In our implementation we chose to reference a predefined file to identify all pipeline net groups in the design. Alternatively, an algorithm could be developed to provide the pipeline net group list information automatically. Also, note that since the list and pipeline net groupings in the model remain unchanged throughout the entire process, the pipeline definition file is generated only during the initial invocation of the algorithm and is referenced during the subsequent TDP invocation.

After the pipelines have been identified, post timing optimization reports are generated and a list of all nets with negative slack is obtained (17.2,17.3). Each net in the negative slack list is then compared to the nets in the pipeline definition list (17.4, 17.5, 17.8, 17.9). If there is a match, all other nets assigned to the same pipeline are selected and their connected cells are added to the list of failing pipeline cells (17.6, 17.7).

After all negative slack nets have been visited, all cells identified in the failing pipeline cell list are unplaced from their existing location (17.10). Next, an incremental placement of these unplaced cells is initiated using the same timing-derived net weight factors that were used to drive the existing model wide placement solution (17.11). Once the equilibrium point solution coordinates have been derived from the quadratic length minimization equations, they are extracted and the incremental placement task is terminated (17.12).

Finally, the unplaced pipeline cells are placed at their derived equilibrium point coordinate (17.13) and legalization is performed to repair all incurred cell overlaps (17.14).

The capabilities of the present invention can be implemented in software, firmware, hardware or some combination thereof.

As one example, one or more aspects of the present invention can be included in a tool set provided as an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately or offered as a service to a customer by providing the process we describe to them as a tool which may be used by a service technician or by the customer themselves.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A service providing for an optimized pipeline structure placement in a circuit design, comprising the steps of:

using a computer, initiating an analysis of pipeline logic structures for correcting poor quality of result (QOR) placements by identifying poor placements caused by placement algorithmic response to degenerate cases and in said analysis preserving high quality placements of a global placement solution to preserve preponderant non-degenerate cases in said circuit design, further comprising the steps of:

in identifying poor placements through a process of identifying circuits involved in a class of degenerate cases containing timing violations, removing circuits having poor placements of said class of degenerate cases by stripping said circuits from the global placement solution and correcting other non-degenerate poor quality placements.

2. A service for an optimized pipeline structure placement in a circuit design according to claim 1, wherein correcting poor quality placements is accomplished using a further process step where said stripped circuits are virtually replaced according to placement algorithms which are executed against said global placement solution as an existing fixed global placement background for a remainder of the design, said virtual replacement generating equilibrium point solution coordinates for said stripped circuits "in-situ" within said existing global placement solution for the remainder of the design.

3. A service for an optimized pipeline structure placement in a circuit design according to claim 2, further including a process step wherein said equilibrium point solution coordinates are used for said stripped circuits as those stripped circuits' new placement locations.

4. A service for an optimized pipeline structure placement in a circuit design according to claim 1, including plurality of global placement steps, wherein each subsequent placement's quality of result (QOR) is dependent upon a prior placement's quality of result (QOR).

5. A program storage device readable by a machine, tangibly embodying at least one program of instructions executable by the machine to perform a service providing for an optimized pipeline structure placement in a circuit design, comprising a storage device containing a plurality of instructions for:

using a computer, initiating an analysis of pipeline logic structures for correcting poor quality of result (QOR) placements by identifying poor placements caused by placement algorithmic response to degenerate cases and in said analysis preserving high quality placements of a global placement solution to preserve preponderant non-degenerate cases in said circuit design, further comprising the steps of:

in identifying poor placements through a process of identifying circuits involved in a class of degenerate cases containing timing violations, removing circuits having poor placements of said class of degenerate cases by stripping said circuits from the global placement solution and correcting other non-degenerate poor quality placements, wherein correcting poor quality placements is accomplished using a further process step where said stripped circuits are virtually replaced according to placement algorithms which are executed against said global placement solution as an existing fixed global placement background for a remainder of the design, said virtual replacement generating equilibrium point solution coordinates for said stripped circuits "in-situ" within said existing global placement solution for the remainder of the design.

6. An article of manufacture having computer usable media having embodied therein computer readable program code means for facilitating an optimized pipeline structure placement in a circuit design, comprising a computer and computer usable media having computer readable program code for:

using said computer, initiating an analysis of pipeline logic structures for correcting poor quality of result (QOR) placements by identifying poor placements caused by placement algorithmic response to degenerate cases and in said analysis preserving high quality placements of a global placement solution to preserve preponderant non-degenerate cases in said circuit design, further comprising the steps of:

in identifying poor placements through a process of identifying circuits involved in a class of degenerate cases containing timing violations, and removing circuits having poor placements of said class of degenerate cases by stripping said circuits from the global placement solution and correcting other non-degenerate poor quality placements wherein correcting poor quality placements is accomplished using a further process step where said stripped circuits are virtually replaced according to placement algorithms which are executed against said global placement solution as an existing fixed global placement background for a remainder of the design, said virtual replacement generating equilibrium point solution coordinates for said stripped circuits "in-situ" within said existing global placement solution for the remainder of the design.

* * * * *